United States Patent [19]

Anderson et al.

[11] Patent Number: 5,241,152
[45] Date of Patent: Aug. 31, 1993

[54] CIRCUIT FOR DETECTING AND DIVERTING AN ELECTRICAL ARC IN A GLOW DISCHARGE APPARATUS

[76] Inventors: Glen L. Anderson, 2922 Amity Rd., Hilliard, Ohio 43204; Peter W. Hammond, 614 Courtview Dr., Greensburg, Pa. 15601; David S. Yotive, 11600 St. Rt. 736, Marysville, Ohio 43040

[21] Appl. No.: 498,343

[22] Filed: Mar. 23, 1990

[51] Int. Cl.⁵ ............................................ B23K 9/06
[52] U.S. Cl. .......................... 219/121.57; 219/121.54; 219/121.43; 219/76.16; 315/123
[58] Field of Search .............. 219/121.54, 121.57, 219/121.36, 76.16, 121.43; 316/111.21, 101, 123; 204/298.35

[56] References Cited

U.S. PATENT DOCUMENTS

| | | | |
|---|---|---|---|
| 3,260,892 | 7/1966 | Berghause ta l. ................ | 315/30 G |
| 3,437,784 | 4/1969 | Jones et al. ...................... | 219/121 |
| 3,702,962 | 11/1972 | Wohr et al. ...................... | 219/69 C |
| 3,867,669 | 2/1975 | Krasik et al. ..................... | 317/16 |
| 3,914,575 | 10/1975 | Eichler ............................ | 219/121.57 |
| 4,193,070 | 3/1980 | Oppel .............................. | 361/100 |
| 4,307,428 | 12/1981 | Yanabu et al. ................... | 361/3 |
| 4,331,856 | 5/1982 | D'Antonio ....................... | 219/121.54 |
| 4,428,023 | 1/1984 | Maier ............................... | 361/100 |
| 4,459,629 | 7/1984 | Titus ................................. | 361/3 |
| 4,476,373 | 10/1984 | D'Antonio ....................... | 219/121.54 |
| 4,645,895 | 2/1987 | Boxman et al. ................. | 219/76.13 |
| 4,825,029 | 4/1989 | Otto ................................. | 361/94 |
| 4,853,046 | 8/1989 | Verhoff et al. .................. | 204/192.35 |

Primary Examiner—Mark H. Paschall

[57] ABSTRACT

An arc diverter detects an arc between the cathode and the anode of a glow discharge apparatus and in response to arc detection, actuates a switching network that triggers a pair of switches to allow a capacitor to discharge toward the cathode along a resonant diverting path and recharge the capacitor for subsequent discharge in an opposite direction. This discharge current effectively short circuits the power supply and extinguishes the arc. The resonant diverting circuit includes two resonant diverting paths and four switches configured in an "H" to hold the capacitor in a charged condition. Alternate triggering of the diagonally situated pairs of switches enables the charged capacitor to discharge in one direction along one of the resonant diverting paths and recharge for subsequent discharge in the opposite direction, along the other of the resonant paths. Both resonant diverting paths provide discharge toward the cathode.

27 Claims, 4 Drawing Sheets

CIRCUIT FOR DETECTING AND DIVERTING AN ELECTRICAL ARC IN A GLOW DISCHARGE APPARATUS

FIELD OF THE INVENTION

This invention relates to an electrical circuit that detects and diverts an arc between two electrodes of a glow discharge apparatus.

BACKGROUND OF THE INVENTION

The phenomena referred to as "glow discharge" is utilized in a variety of commercial applications, including glass coating, cathode sputtering, reactive ion etching, nitriding and carburizing, to name a few. Basically, a glow discharge occurs when an ionizable gas is introduced into an evacuated chamber between two electrodes of different electrical potential, the potential difference between the electrodes being sufficient to ionize the gas. This potential difference may be anywhere from 200 volts to 800 volts dc.

Once ionized, the positively charged ions are attracted by, and move toward the cathode. A material mounted to the cathode can be coated by impacting ions in this manner. In other glow discharge processes such as sputtering, for example, impacting ions dislodge particles of a target material and cause the dislodged particles to be deposited as a thin film on a substrate to be coated. The substrate is usually mounted to the anode, opposite from the target. Sputter coating of this type is particularly useful in coating a sheet of glass for tinting, or imparting a low emissivity to the glass to block infrared light. Materials such as titanium, zinc, gold, aluminum, or silver may be sputter coated onto glass. A glow discharge apparatus may be planar or cylindrical.

To increase the efficiency of the glow discharge process, a magnet may be located adjacent to the cathode to superimpose a magnetic field over the target and form a denser plasma. A magnetron glow discharge apparatus of this type is disclosed in U.S. Pat. No. 4,422,916, which is expressly incorporated by reference herein in its entirety.

Due to the relatively high d.c. voltage applied between the anode and cathode of a glow discharge apparatus, electrical shorting or arc formation may occur with a relatively high frequency, as often as 2000 times or more per second. While some of these electrical arcs may extinguish due to fluctuation of gas pressure in the chamber, many other electrical arcs will persist until power is disconnected. Current levels during an electrical arc may be as high as 300 amps, depending upon the operating voltage. At these current levels, arcing may damage the power supply, the target material at the cathode or the substrate at the anode. To avoid this potential damage, it is critical that electrical arcs between the electrodes of a glow discharge machine be detected and terminated as quickly as possible.

In some systems electrical arc suppression is accomplished by momentarily disconnecting a rectified a.c. power supply. However, once disconnected, it is possible that power may not be resupplied to the electrodes until another half of an electrical cycle has elapsed. For power supplies operating at relatively low frequencies, this delay presents a problem. For example, a three phase, 6 pulse unit, 60Hz power supply is commonly employed in many glow discharge operations, due to both practical and economical reasons. Once a power supply of this type has been interrupted, it is possible that power will not be resupplied to the electrodes for another 2.66 milliseconds. Additional time is also required for the energy stored in the inductor in the power supply to dissipate. This time is typically about 50 milliseconds. In view of the high frequency of arcing, i.e., as often as every 500 microseconds, this time duration is simply not acceptable.

Even if arcing does not actually occur with such a high degree of frequency, the time delay associated with any arcing at all is considered unacceptable because it reduces the machine's "throughput", i.e., rate of processing, and production efficiency suffers.

While high frequency power supplies, i.e., those on the order of 10KHz, could be employed to solve the above-noted problem by simply reducing the time of an electrical half cycle, high frequency power supplies are generally very expensive, and due to rippling effects, it is difficult to maintain a consistent high power level at the electrodes.

Another approach to arc suppression involves the use of a capacitor connected across the electrodes, with a polarity the same as that of the power supply. When an arc occurs, the capacitor initially dumps its stored charge into the arc, and then extinguishes the arc during recharge. Although this approach does not necessitate temporary disconnection of the power supply, this "dumping" of charge from the capacitor often adversely affects the material mounted at the cathode, an effect sometimes referred to as "splattering."

It is therefore an object of this invention to provide an electrical circuit that quickly and effectively detects and suppresses an electrical arc between two electrodes of a glow discharge apparatus.

It is another object of this invention to provide an electrical circuit that suppresses an arc between two electrodes of a glow discharge apparatus without requiring the time delays normally associated with disconnection of the electrical power supply to the apparatus.

It is still another object of the invention to provide an electrical circuit that effectively suppresses an electrical arc in a glow discharge apparatus supplied by a 60Hz electrical power supply.

It is still another object of this invention to provide a relatively simple and efficient electrical circuit that may be installed between a glow discharge apparatus and a 60Hz power supply in order to provide fast arc detection and suppression.

SUMMARY OF THE INVENTION

This invention contemplates an electrical circuit that detects an arc between two electrodes and then initiates discharge of a charged capacitor toward the cathode and along a resonant path to divert current from the electrodes and extinguish the arc.

The resonant diverting circuit includes two pairs of switches, where one of the switches from each of the pairs holds the capacitor in a charged state. Upon arc detection, a switching network triggers one of the two holding switches to allow discharge of the capacitor in a first direction along a first resonant diverting path. The first resonant diverting path includes an inductor, the holding switch which is located between the capacitor and the cathode, a diode which is located between the cathode and the anode, and another switch which completes the loop and enables the capacitor to recharge for subsequent discharge in an opposite direction.

When triggered, the half sine wave current pulse along the resonant diverting path exceeds the process current. The current flow through the diode toward the anode forces the voltage across the electrodes to near zero for a time determined by the capacitance and inductance values of the resonant diverting circuit. This effectively short circuits the power supply and diverts current from the electrodes, thus suppressing and extinguishing the arc. The capacitor is also recharged at the end of the current pulse so that it may be subsequently discharged in an opposite direction. Upon the next arc detection, the switching network simultaneously triggers the other pair of switches to allow the capacitor to discharge in the opposite direction, and current flows along a second resonant diverting path. Upon each subsequent arc detection, the diverting circuit is triggered to alternate discharging of the capacitor back and forth between the first and second resonant diverting paths.

The four switches surround the capacitor in an H configuration. Although the capacitor alternately discharges in opposite directions, the four switches are configured so that the polarity of the charged capacitor is always opposite to that of the connected power supply. Thus, for both resonant diverting paths, current flow is routed first to the cathode and then to the anode and back to the capacitor for recharging.

In accordance with a preferred embodiment of the invention, an arc diverter for extinguishing an arc between two electrodes of a glow discharge apparatus includes a detector, a resonant diverting circuit and a switching network. The detector detects an arc condition between two electrodes of a plasma discharge apparatus when the electrode voltage differential falls below a predetermined set point voltage. The resulting signal actuates a switching network which triggers a pair of switches in the resonant diverting circuit to allow the capacitor to discharge in a first direction toward the cathode and along the first resonant diverting path. Upon the next arc detection, the switching network triggers the other pair of switches to allow the capacitor to discharge in the other direction, but still toward the cathode, and along the second resonant diverting path. Subsequently, upon each detection, the switching network alternately triggers one of the two pairs of switches to discharge the capacitor in a direction opposite that of the previous discharging.

For a glow discharge apparatus operating at about 200 amps at a voltage of about 800 volts D.C., an arc diverter of the type described can detect and extinguish an arc within about 100 microseconds. It is important to note that the power supply must have a sufficient inductance to prevent a significant current change within this time period. This inductance may be as low as 8-10 millihenrys, a value that is lower than the inductance value commonly utilized in power supplies of this type to provide normal nipple reduction.

According to another feature of the invention, the switching network includes a current limit circuit which senses the current flowing in the resonant diverting circuit. The magnitude of the sensed current is used to control the length of time that must lapse before the switching network can be triggered again. The higher the magnitude of the sensed current, the longer the duration before the next triggering.

The switching network also provides circuitry for preventing simultaneous triggering of both pairs of switches, and a retrigger circuit that retriggers one pair of the switches to cause a second diversion if the initial diversion produced by the originally triggered pair of switches did not extinguish the arc. At start up, a start-up portion of this retrigger circuit prevents "free running" of the retrigger mode until the capacitor has been initially charged.

Additionally, the detector includes a counter to indicate the number of times an arc has been detected.

These and other features of the invention will be more readily understood in view of the detailed description and the drawings in which:

DETAILED DESCRIPTION OF THE INVENTION

Figure 1:
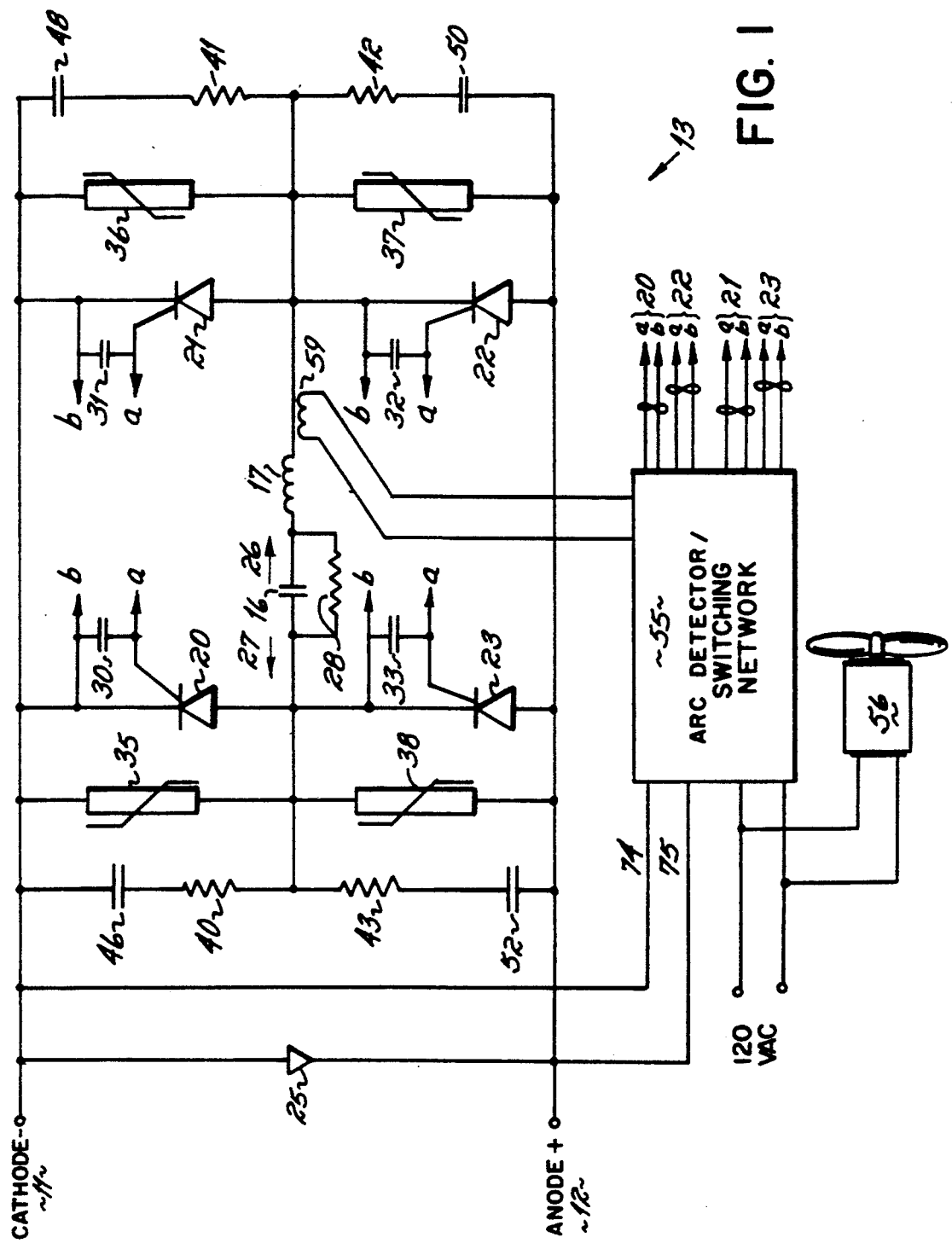
FIG. 1 is a circuit schematic of a resonant diverting circuit used in an arc diverter in accordance with a preferred embodiment of the invention.
Figure 2A:
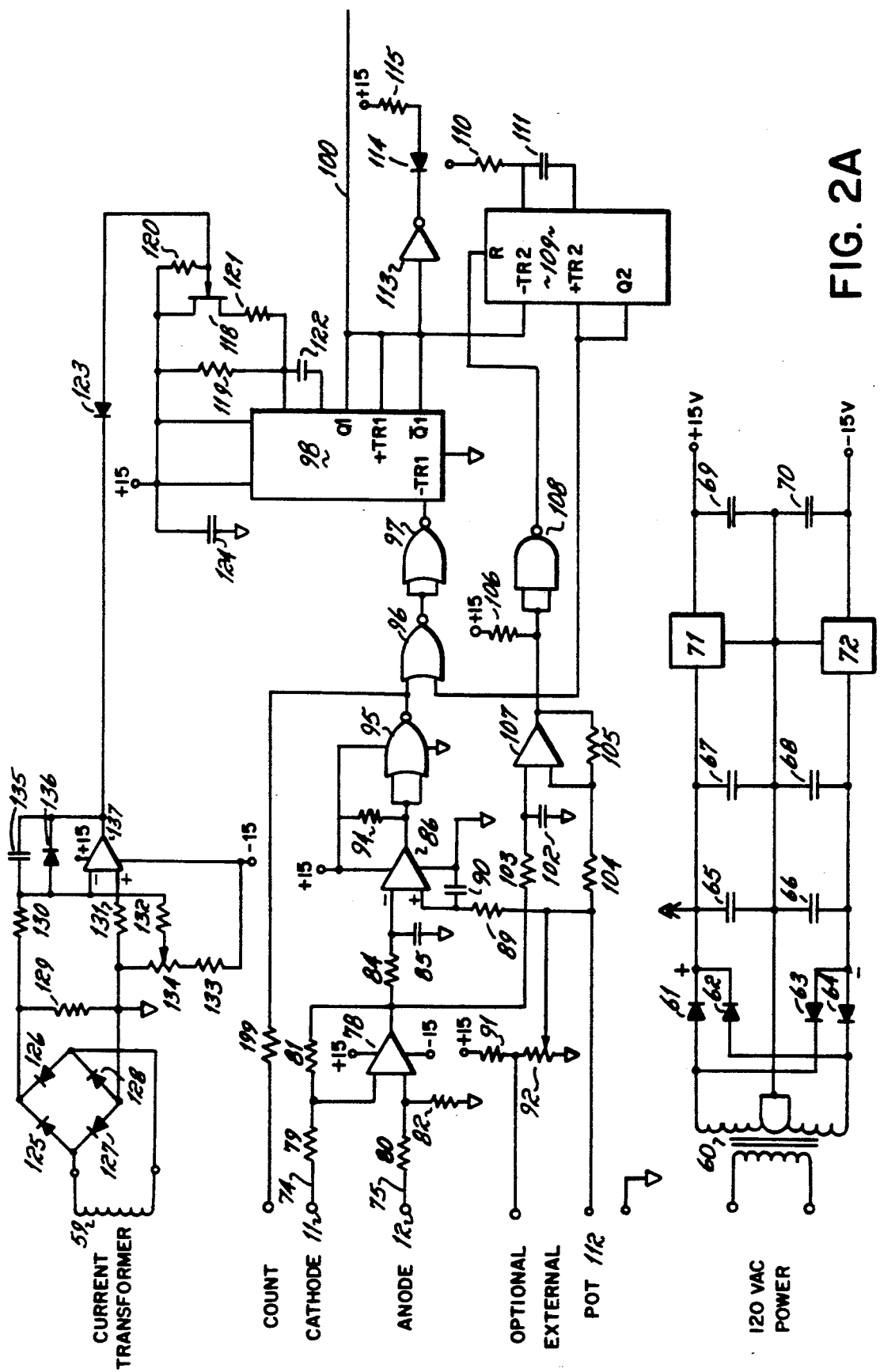
FIGS. 2A and 2B are circuit schematics of a detector and a switching network used in an arc diverter in accordance with the preferred embodiment of the invention.
Figure 2B:
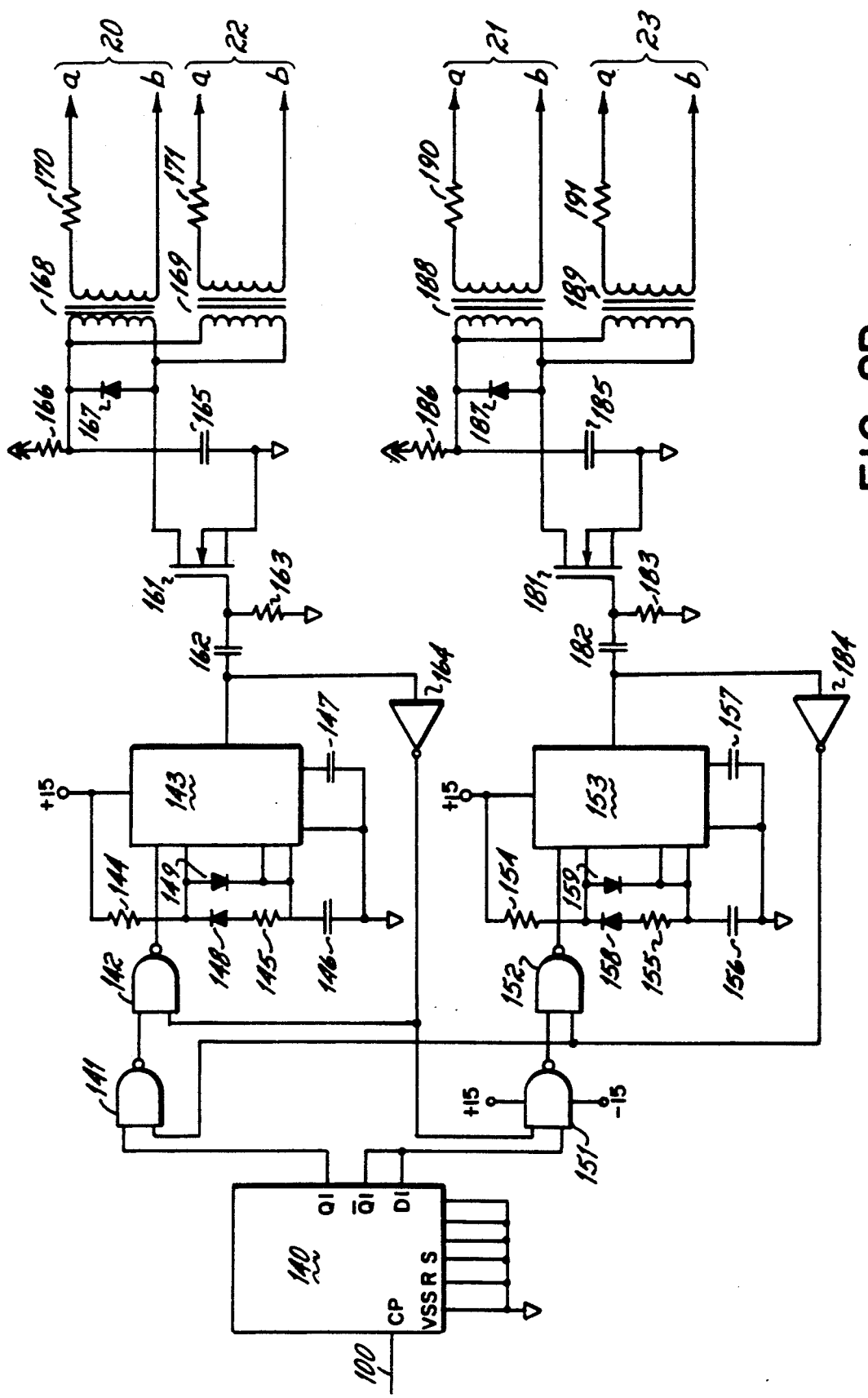

FIGS. 1, 2A and 2B show circuit schematics for an arc diverter 10 in accordance with a preferred embodiment of the invention. The arc diverter 10 detects and extinguishes an arc between a cathode 11 and an anode 12 of a plasma discharge apparatus (not shown). Generally, the arc diverter 10 includes a detector, a resonant diverting circuit and a switching network.

FIG. 1 shows the electrical components of the resonant diverting circuit. The diverting circuit includes a capacitor 16 and an inductor 17 in series, and isolated in an "H" configuration by four switches, numbered 20, 21, 22 and 23. The switches are triggered by the switching network, and are preferably SCRs. Until triggering, switches 20 and 21 hold the capacitor 16 in a charged condition. When an arc between cathode 11 and anode 12 is detected, the switching network is actuated to trigger, either switch pair 23 and 21 or switch pair 22 and 20. When switches 21 and 23 are simultaneously triggered, the capacitor 16 discharges in the direction shown by directional arrow 26. When switches 20 and 22 are simultaneously triggered, capacitor 16 discharges in the direction shown by directional arrow 27. The switching network is designed to alternate triggering of these switch pairs upon subsequent arc detections. The switching network is also designed to prevent simultaneous triggering of both sets of switches.

Depending upon which switch pair has been triggered, discharge of capacitor 16 will produce an electrical current through either switch 20 or switch 21. In either case, the electrical current is initially in the direction of cathode 11. The current continues through diode 25, then via the anode to pass through either switch 22 or 23 to recharge capacitor 16 for subsequent discharge in an opposite direction. Thus, the four switches and the diode 25 define two resonant diverting paths for a current pulse produced by discharge of capacitor 16. One of the diverting paths includes switch 21, cathode 11, diode 25, anode 12 and then switch 23. The other of the diverting paths includes switch 20, cathode 11, diode 25, anode 12 and switch 22. Preferably, the diverting circuit also includes a resistor 28 to protect the capacitor 16. Capacitors 30, 31, 32 and 33 also provide protection for switches 20, 21, 22 and 23, respectively. Additional circuit protection is provided by voltage suppressors 35, 36, 37 and 38, resistors 40, 41, 42 and 43, and capacitors 46, 48, 50 and 52. Values and/or part numbers for the electronic components shown in FIGS. 1, 2A and 2B are included in an Appendix at the end of this detailed description.

FIG. 1 also shows a detector and switching network, generally indicated by numeral 55. A fan 56 may be used to provide cooling of the components of the arc diverter 10. Alternatively, the components may be water cooled. FIG. 1 also shows a current transformer 59 used to sense current in the resonant diverting circuit.

The bottom portion of FIG. 2A depicts a conventional d.c. power supply for the various components of the arc diverter 10.

FIG. 2A also shows the electronic components that form the detector. Electrical conductors 74 and 75, also shown in FIG. 1, are connected to the cathode 11 and anode 12, respectively. Operational amplifier 78 and resistors 79, 80, 81 and 82 provide a standard differential input amplifier for amplifying the voltage difference between the cathode 11 and the anode 12. When an arc occurs between cathode 11 and anode 12, the output from amplifier 78 falls to a lower level then when the glow discharge apparatus is operating in a steady state mode, with a stable plasma. Voltage comparator 86 compares the differential voltage with a set point voltage provided by potentiometer 92. When the voltage from amplifier 78 falls below the level set by potentiometer 92, the output of comparator 86 indicates an arc condition, and a signal is provided to NOR gate 95. This signal is fed via NOR gates 96 and 97 to the trigger input of main one shot 98 which provides an output pulse on line 100 with a duration determined by capacitor 122 and resistors 119 and 121 and field effect transistor 118.

This duration is initiated by the current flow in coil 17 sensed by current transformer 59. A counter-voltage generated in response to frequency of current flow through coil 59 is rectified by diodes 125, 126, 127 and 128 to produce a current flow of about one amp through resistor 129 and to develop a voltage of about 100 millivolts. This voltage is compared with a voltage set by potentiometer 134 and integrated by operational amplifier 137. The signal from operational amplifier 137 affects the operating point of FET 118. If high current frequency is detected by current transformer 59, the bias voltage for FET 118 is decreased, and the pulse width output supplied on line 100 is increased. This circuitry protects the diverting circuit by limiting the frequency of firing, i.e., by increasing the duration of time that must elapse before the next triggering pulse.

The pulse from one-shot 98 is input, via line 100, to the clock input of flip flop 140 to toggle its output. The output signals of flip flop 140 alternately drive pulse generators 143 and 153 and their associated components to ultimately control triggering of SCRs 20, 21, 22 and 23. Pulse generator 143 drives SCR pair 20 and 22 and pulse generator 153 drives SCR pair 21 and 23. NAND gates 141, 142, 151, 152 and inverters 164 and 184 prevent simultaneous actuation of both sets of switches.

The pulse on line 100 is also input to another one-shot 109, and after a time delay established by resistor 110 and capacitor 111, a signal via NOR gate 96 retriggers the main one-shot 98 if the first current pulse does not extinguish the arc. At start up, the switches are initially "on" to charge the capacitor 16. A starting circuit that includes capacitor 102, comparator 107 and NAND gate 108 is input to the reset of flip flop 109 to prevent "free running" of this retriggering mode of the diverting circuit until the power supply has fully charged capacitor 16.

The optional external potentiometer 112 or potentiometer 92 may be varied to change the sensitivity of the detector. By increasing the input voltage to comparator 86, a lesser decrease in the differential voltage between the cathode 11 and the anode 12 is required to signal an arcing condition.

Figure 3:
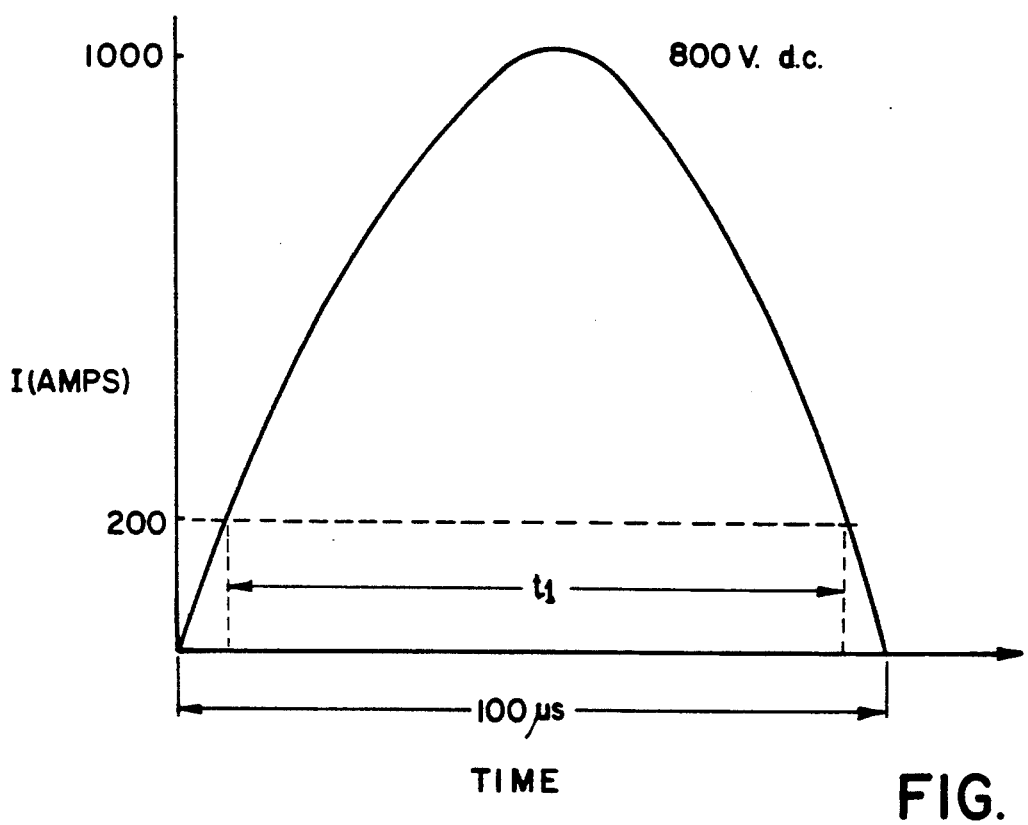
FIG. 3 is a graph depicting current versus time for current flowing in the resonant diverting circuit along one of the two resonant diverting paths.

FIG. 3 shows a current pulse produced when the diverting circuit is triggered. If the operating current is about 200 amps, the diverting current exceeds the operating current from time $T_1$ until time $T_2$, or for a duration indicated as $t_3$, which is less than 100 microseconds.

While I have described a preferred embodiment of the arc diverter of this invention, it is to be understood that the invention is not limited thereby and that in light of the present disclosure of the invention, various other alternative embodiments will be apparent to a person skilled in the art. Accordingly, it is to be understood that changes may be made without departing from the scope of the invention as particularly set forth and claimed.

APPENDIX

| | |
|---|---|
| 10 | arc diverter |
| 11 | cathode connection |
| 12 | anode connection |
| 16 | 45 microfarads |
| 17 | 30 microhenrys |
| 20 | SCR 200A/2000V |
| 21 | SCR 200A/2000V |
| 22 | SCR 200A/2000V |
| 23 | SCR 200A/2000V |
| 25 | diode IN914B |
| 28 | 10K ohms |
| 30 | 0.047 microfarads |
| 31 | 0.047 microfarads |
| 32 | 0.047 microfarads |
| 33 | 0.047 microfarads |
| 35 | voltage suppressor V751DB40 |
| 36 | voltage suppressor V751DB40 |
| 37 | voltage suppressor V751DB40 |
| 38 | voltage suppressor V751DB40 |
| 40 | 25 ohms |
| 41 | 25 ohms |
| 42 | 25 ohms |
| 43 | 25 ohms |
| 46 | 0.22 microfarads |
| 48 | 0.22 microfarads |
| 50 | 0.22 microfarads |
| 52 | 0.22 microfarads |
| 55 | arc detector/switching network |
| 59 | 200:1 current transformer |
| 60 | turn ratio 120:36CT |
| 61 | diode 3N248 |
| 62 | diode 3N248 |
| 63 | diode 3N248 |
| 64 | diode 3N248 |
| 65 | 1000 microfarads |
| 66 | 1000 microfarads |
| 67 | 0.1 microfarads |
| 68 | 0.1 microfarads |
| 69 | 0.1 microfarads |
| 70 | 0.1 microfarads |
| 71 | voltage regulator 7815 |
| 72 | voltage regulator 7915 |
| 78 | differential amplifier OP 07 |
| 79 | 1.0M ohm |
| 80 | 1.0M ohm |
| 81 | 1.0K ohm |

APPENDIX-continued

| | |
|---|---|
| 82 | 1.0K ohm |
| 84 | 10K ohm |
| 85 | 0.001 microfarad |
| 86 | comparator 3302 |
| 89 | 10K ohm |
| 90 | 0.1 microfarad |
| 91 | 2.74K ohm |
| 92 | potentiometer 200 ohm |
| 94 | 10K ohms |
| 95 | NOR 4001 |
| 96 | NOR 4001 |
| 97 | NOR 4001 |
| 98 | one-shot 4098 |
| 102 | 1.0 microfarad |
| 103 | 100K ohms |
| 104 | 10K ohms |
| 105 | 1.0M ohms |
| 106 | 10K ohms |
| 107 | comparator 3302 |
| 108 | NOR 4001 |
| 109 | flip flop 4098 |
| 110 | 10K ohms |
| 111 | 0.01 microfarads |
| 112 | optional external potentiometer 200 ohms |
| 113 | INVERTER 4049 |
| 114 | LED |
| 115 | 1.0K ohms |
| 118 | FET ZN4392 |
| 119 | 121K ohms |
| 120 | 1.0M ohms |
| 121 | 20K ohms |
| 122 | 0.047 microfarads |
| 123 | diode 1N914B |
| 124 | 0.01 microfarads |
| 125 | diode 3N248 |
| 126 | diode 3N248 |
| 127 | diode 3N248 |
| 128 | diode 3N248 |
| 129 | 0.1 ohms |
| 130 | 100K ohms |
| 131 | 49.9K ohms |
| 132 | 100K ohms |
| 133 | 30.1K ohms |
| 134 | potentiometer 200 ohms |
| 135 | 0.001 microfarads |
| 136 | diode 1N914B |
| 137 | differential amplifier OP 07 |
| 140 | flip flop 4013 |
| 141 | NAND 4011 |
| 142 | NAND 4011 |
| 143 | multivibrator 555 |
| 144 | 6.81K ohms |
| 145 | 49.9K ohms |
| 146 | 0.01 microfarads |
| 147 | 0.1 microfarads |
| 148 | diode 1N914B |
| 149 | diode 1N914B |
| 151 | NAND 4011 |
| 152 | NAND 4011 |
| 153 | multivibrator 555 |
| 154 | 6.81K ohms |
| 155 | 49.9K ohms |
| 156 | 0.01 microfarads |
| 157 | 0.1 microfarads |
| 158 | diode 1N914B |
| 159 | diode 1N914B |
| 161 | FET BUZ 60 |
| 162 | 0.005 microfarads |
| 163 | 1K ohm |
| 164 | INVERTER 4049 |
| 165 | 0.47 microfarads |
| 166 | 100 ohms |
| 167 | diode 1N914B |
| 168 | turns ratio 1:1 |
| 169 | turns ratio 1:1 |
| 170 | 10 ohms |
| 171 | 10 ohms |
| 181 | FET BUZ 60 |
| 182 | 0.005 microfarads |
| 183 | 1K ohm |
| 184 | INVERTER 4049 |
| 185 | 0.47 microfarads |

APPENDIX-continued

| | |
|---|---|
| 186 | 100 ohms |
| 187 | diode 1N914B |
| 188 | turns ratio 1:1 |
| 189 | turns ratio 1:1 |
| 190 | 10 ohms |
| 191 | 10 ohms |

I claim:

1. An arc diverter for extinguishing an arc in a glow discharge apparatus comprising:
   a detector adapted to detect an arc between two electrodes of a glow discharge apparatus;
   a resonant diverting circuit adapted to discharge a stored charge along one of two resonant diverting paths to divert electrical current from said electrodes to extinguish the arc and restore said charge for subsequent discharge along the other of the two resonant diverting paths, said resonant diverting circuit including a capacitor for holding said stored charge, the capacitor being dischargeable and rechargeable in two directions and lying in both of said resonant diverting paths; and
   a switching network actuated by the detector to trigger the resonant diverting circuit to divert the electrical current along a first of the resonant diverting paths upon an initial actuation by the detector, along a second of the paths upon a subsequent actuation by the detector, and to alternate current diversion between the two paths thereafter upon subsequent arc detections.

2. The arc diverter of claim 1 wherein said resonant diverting circuit further comprises:
   an inductor in series with the capacitor and having an inductance selected to provide discharging and recharging of said diverting circuit within about 1000 microseconds.

3. The arc diverter of claim 1 wherein said resonant diverting circuit further includes a diode which lies in both of said diverting paths.

4. The arc diverter of claim 1 wherein said resonant diverting circuit further comprises:
   four switches, a first pair of said switches forming part of a first resonant diverting path and adapted to be triggered simultaneously by the switching network to discharge said stored charge along said first resonant diverting path and to restore said charge for subsequent discharge along a second of said resonant diverting paths, a second pair of said switches forming part of said second resonant diverting path and adapted to be triggered simultaneously by the switching network to discharge said stored charge along said second resonant diverting path and to restore said charge for subsequent discharge along said first resonant diverting path.

5. The arc diverter of claim 4 wherein the four switches in the diverting circuit are SCRs.

6. The arc diverter of claim 1 wherein the resonant diverting circuit further comprises:
   four switches isolating the capacitor and holding it in a charged condition between the electrodes, a first pair of said switches forming part of a first resonant diverting path and triggered simultaneously by the switching network to enable discharging of the capacitor in a first direction along the first resonant diverting path to divert current from the electrodes and recharge the capacitor for subsequent discharge in an opposite direction, a second pair of the switches forming part of a second resonant diverting path and triggered simultaneously by the switching network to enable discharge of the capacitor in said opposite direction and along said second resonant diverting path to divert current from the electrodes and recharge the capacitor for subsequent discharge in said first direction.

7. The arc diverter of claim 6 wherein the resonant diverting circuit further comprises:
an inductor in series with the capacitor and having an inductance selected to provide discharging and recharging of said capacitor within about 100 microseconds.

8. The arc diverter of claim 6 wherein the four switches are SCRs.

9. The arc diverter circuit of claim 1 wherein said detector further comprises:
a counter to count the number of times an arc has been detected.

10. The arc diverter of claim 1 wherein said switching network further comprises:
means for sensing current flow through said diverting circuit to establish a time duration before the next triggering of said resonant diverting circuit.

11. The arc diverter of claim 4 wherein said switching network further comprises:
means for assuring that said first and second pairs of switches are not triggered simultaneously.

12. The arc diverter of claim 1 wherein said detector further includes a comparator for comparing the voltage across the electrodes with a predetermined set voltage and further comprising:
a potentiometer for varying the predetermined set voltage.

13. The arc diverter of claim 1 wherein said switching network further comprises:
a retrigger circuit to retrigger said resonant diverting circuit if a first current pulse does not extinguish the detected arc.

14. The arc detector of claim 13 wherein said retrigger circuit further comprises:
a start up circuit to inhibit said retrigger circuit until a predetermined time delay has elapsed.

15. The combination of claim 1 wherein the glow discharge apparatus includes a cathode and the switching network diverts electrical current toward the capacitor.

16. An arc diverter for extinguishing an arc in a glow discharge apparatus comprising:
a detector adapted to detect an arc between two electrodes of a glow discharge apparatus;
a switching network actuated by the detector upon detection of an arc; and
a resonant diverting circuit including a capacitor and four switches, the capacitor adapted to be electrically isolated in a charged condition between said electrodes by said four switches;
a first pair of said four switches forming part of a first resonant diverting path and adapted to be triggered simultaneously by the switching network upon initial detection of an arc to enable discharge of the capacitor in a first direction to divert electrical current from the electrodes and extinguish the arc and to recharge the capacitor for subsequent discharge in an opposite direction; and
a second pair of said switches forming part of a second resonant diverting path and adapted to be triggered simultaneously by the switching network upon the next detection of an arc to enable discharge of the capacitor in a second direction along the second resonant diverting path to divert electrical current from the electrodes and extinguish the arc and to recharge the capacitor for subsequent discharge in said first direction, said first and second pairs of switches being alternately triggered by said switching network upon subsequent actuations.

17. The arc diverter of claim 16 wherein the resonant diverting circuit further comprises:
a diode connected electrically across the electrodes and residing in both said first and said second resonant diverting paths.

18. The arc diverter of claim 16 wherein said detector further comprises:
a counter for counting the number of times an arc has been detected.

19. The arc diverter of claim 16 wherein the switching network further comprises:
means for assuring that both said pairs of switches are not triggered simultaneously.

20. The arc diverter of claim 16 wherein the switching network further comprises:
means for sensing current flow through said diverting circuit to establish a time duration before the next triggering of said resonant diverting circuit.

21. The arc diverter of claim 16 wherein said detector further includes a comparator for comparing the voltage across the electrodes with a predetermined set voltage and further comprising:
a potentiometer for varying the predetermined set voltage.

22. A method for extinguishing an arc in a glow discharge apparatus comprising the steps of:
detecting an arc between two electrodes of a glow discharge apparatus;
discharging, in response to said detection, a stored charge in a first direction along one of two resonant diverting paths to divert electrical current from the electrodes and extinguish the arc and restore a charge for subsequent discharge in an opposite direction along the other of the two resonant diverting paths; and
alternating the direction of discharge and the path of current diversion upon each subsequent detection of an arc between said electrodes.

23. A method for extinguishing an arc in a glow discharge apparatus comprising the steps of:
detecting an arc between two electrodes of a glow discharge apparatus;
discharging, in response to an initial detection, a charged capacitor in a first direction to divert electrical current from the electrodes and extinguish the arc therebetween and recharge the capacitor for subsequent discharge in an opposite direction; and
discharging, in response to the next detection of an arc, the recharged capacitor in said opposite direction to divert electrical current from the electrodes and extinguish the arc therebetween and to again recharge the capacitor for subsequent discharge in said first direction.

24. The method of claim 23 and further comprising the step of:
controlling a first set of switches in a switching network to trigger discharge of the capacitor in said first direction upon initial detection of an arc and also controlling a second set of switches in the switching network to trigger discharge of the capacitor in said opposite direction upon the next detection of an arc; and alternately triggering said first set of switches and said second set of switches upon each subsequent detection of an arc.

25. The method of claim 24 and further comprising the step of:

counting the number of times an arc has been detected.

26. The combination comprising:

a glow discharge apparatus including two electrodes;

a detector adapted to detect an arc between the electrodes;

a resonant diverting circuit adapted to discharge a stored charge along one of two resonant diverting paths to divert electrical current from said electrodes to extinguish the arc and restore said charge for subsequent discharge along the other of the two resonant diverting paths; and a switching network actuated by the detector to trigger the resonant diverting circuit to divert the electrical current along a first of the resonant diverting paths upon an initial actuation by the detector, along a second of the paths upon a subsequent actuation by the detector, and to alternate current diversion between the two paths thereafter upon subsequent arc detections.

27. The combination comprising:

a glow discharge apparatus including two electrodes;

a detector adapted to detect an arc between the electrodes;

a switching network actuated by the detector upon detection of an arc;

a resonant diverting circuit including a capacitor and four switches, the capacitor adapted to be electrically isolated in a charged condition between said electrodes by said four switches;

a first pair of said four switches forming part of a first resonant diverting path and adapted to be triggered simultaneously by the switching network upon initial detection of an arc to enable discharge of the capacitor in a first direction to divert electrical current from the electrodes and extinguish the arc and to recharge the capacitor for subsequent discharge in an opposite direction; and a second pair of said switches forming part of a second resonant diverting path and adapted to be triggered simultaneously by the switching network upon the next detection of an arc to enable discharge of the capacitor in a second direction along the second resonant diverting path to divert electrical current from the electrodes and extinguish the arc and to recharge the capacitor for subsequent discharge in said first direction, said first and second pairs of switches being alternately triggered by said switching network upon subsequent actuations.

* * * * *